(12) United States Patent
Kiong et al.

(10) Patent No.: US 8,124,471 B2
(45) Date of Patent: Feb. 28, 2012

(54) METHOD OF POST-MOLD GRINDING A SEMICONDUCTOR PACKAGE

(75) Inventors: James-Yii Lee Kiong, Penang (MY);
Chong Hin Tan, Penang (MY);
Shivaram Sahadevan, Penang (MY);
Max Mah Boon Hooi, Perai (MY);
Tang Shiau Phing, Pulau Penang (MY)

(73) Assignee: Intel Corporation, Santa Clara, CA (US)

( * ) Notice: Subject to any disclaimer, the term of this patent is extended or adjusted under 35 U.S.C. 154(b) by 831 days.

(21) Appl. No.: 12/046,385

(22) Filed: Mar. 11, 2008

(65) Prior Publication Data

US 2009/0230567 A1 Sep. 17, 2009

(51) Int. Cl.
*H01L 21/8238* (2006.01)
(52) U.S. Cl. ........ 438/225; 438/387; 438/126; 438/459; 438/465; 438/959
(58) Field of Classification Search .................. 438/126, 438/459, 465, 225, 387
See application file for complete search history.

(56) References Cited

U.S. PATENT DOCUMENTS

| | | | | |
|---|---|---|---|---|
| 4,764,413 A * | 8/1988 | Nukii et al. | ............... | 428/192 |
| 5,480,842 A * | 1/1996 | Clifton et al. | ............... | 438/464 |
| 2003/0036219 A1 * | 2/2003 | Masumoto et al. | ......... | 438/107 |
| 2004/0115862 A1 * | 6/2004 | Kung et al. | ............... | 438/106 |

* cited by examiner

*Primary Examiner* — Steven Loke
*Assistant Examiner* — Kimberly M Thomas
(74) *Attorney, Agent, or Firm* — Winkle, PLLC

(57) ABSTRACT

A method of grinding a molded semiconductor package to a desired ultra thin thickness without damage to the package is disclosed. Prior to grinding a molded package to a desired package thickness, the package may be protected from excessive mechanical stress generated during grinding by applying a protective tape to enclose interconnects formed on the package. This way, the protective tape provides support to the semiconductor package during package grinding involving the mold material as well as the die. In the post-grind package, the grinded die surface may be exposed and substantially flush with the mold material. The protective tape may then be removed to prepare the post-grind package for connection with an external device or PCB.

10 Claims, 3 Drawing Sheets

METHOD OF POST-MOLD GRINDING A SEMICONDUCTOR PACKAGE

BACKGROUND

1. Technical Field

Embodiments of the invention relate to post-mold grinding of a molded semiconductor package.

2. Description of Related Art

Demand for miniaturized semiconductor devices behooves the continuing pursuit to produce thinner and slimmer semiconductor devices.

One method of producing thinner semiconductor devices involves grinding or thinning a semiconductor wafer prior to packaging. However, wafer thinning poses severe limitations to the desired wafer thickness and yet introduces undesirable yield and reliability issues. More particularly, as the thickness of a semiconductor wafer reduces, its capacity for withstanding mechanical stress also reduces, thereby increasing the risk of die warpage. With this increased risk of die warpage, semiconductor device manufactures are impeded from further reducing thickness of semiconductor devices as they would have desired.

DETAILED DESCRIPTION OF ILLUSTRATIVE EMBODIMENTS

Figure 1:
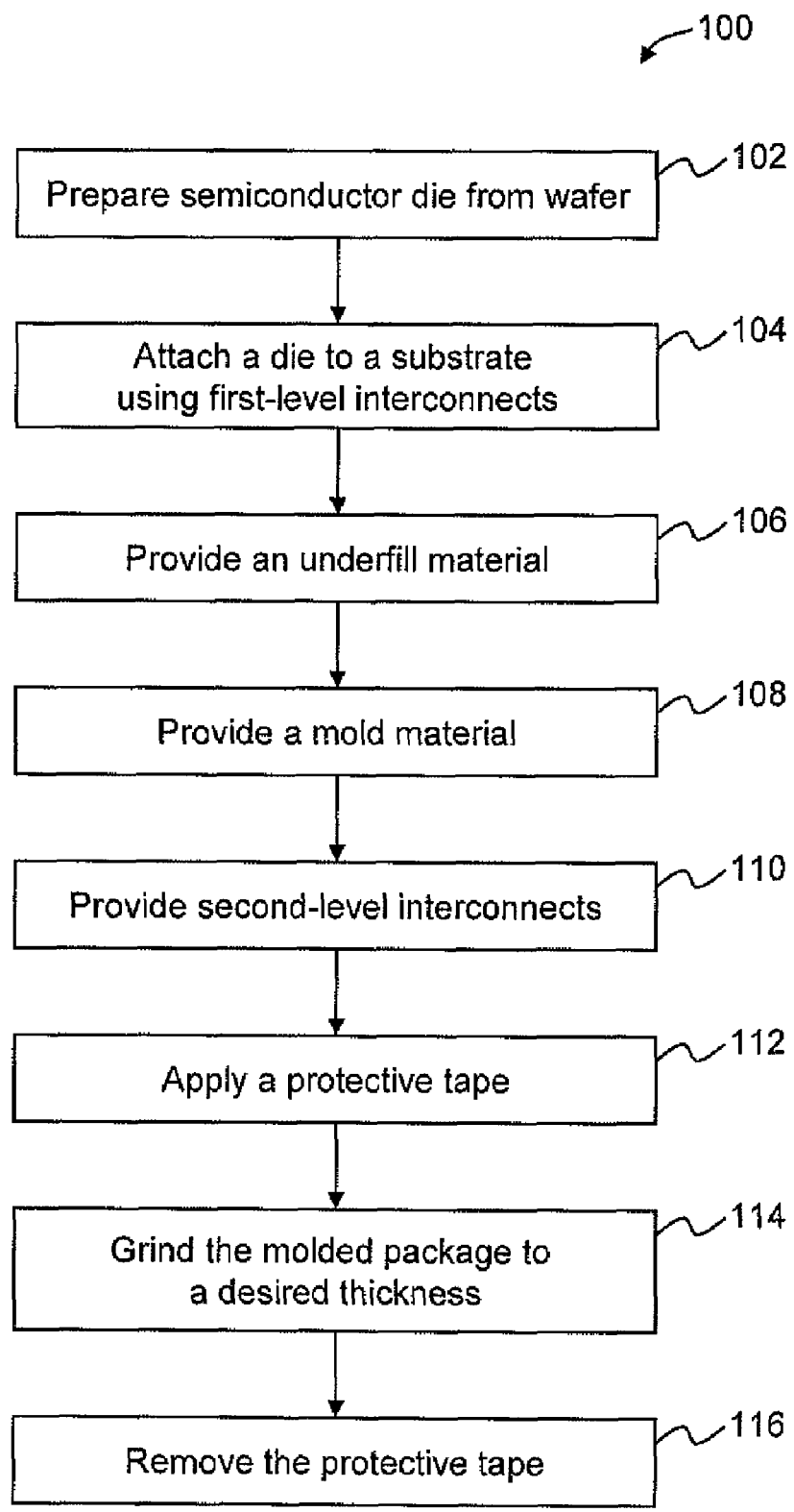
FIG. 1 is a flow chart summarizing a process sequence according to one embodiment of the invention.

In the following description, numerous specific details are set forth in order to provide a thorough understanding of various illustrative embodiments of the present invention. It will be understood, however, to one skilled in the art, that embodiments of the present invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

FIG. 1 is a flow chart summarizing a process sequence 100 according to one embodiment of the invention. The process sequence 100 will be described with further reference to FIGS. 2A to 2D illustrating various process outputs obtained during the sequence 100 of FIG. 1.

The process sequence 100 begins with die preparation (block 102) during which a semiconductor wafer may be singulated into individual dice or into strips containing multiple die by wafer mounting and wafer sawing. During wafer mounting, a semiconductor wafer may be attached to a wafer or dicing tape to ensure the individual dice remain firmly in place during wafer sawing. During wafer sawing, the semiconductor wafer is cut into individual dice or into strips containing multiple die for assembly into integrated circuit (IC) packages. A cleaning process may follow, involving washing the diced wafers with de-ionised water and drying the diced semiconductor wafers by air-blowing.

After die preparation (block 102), the process sequence 100 proceeds with die attachment (block 104) during which the die 12 is mounted and attached to a substrate 14 or support structure. The substrate 14 may comprise FR4, bismaleimide trazine (BT), ceramic, polyimide, and/or other known materials. First-level interconnects 16, e.g., solder bumps, or other known methods, may be provided to couple the die 12 to the substrate 14. An underfill material may then be provided between the die 12 and the substrate 14 using a capillary underfill process or other known processes (block 106). The resulting structure in which the die 12 is attached to the substrate 14 may then be subject to a molding process, e.g. transfer molding, in which the die 12 is encapsulated in a plastic material (block 108). After the molding process, the die 12 may be partially or fully encapsulated in the mold material 20 as required.

Figure 2A:
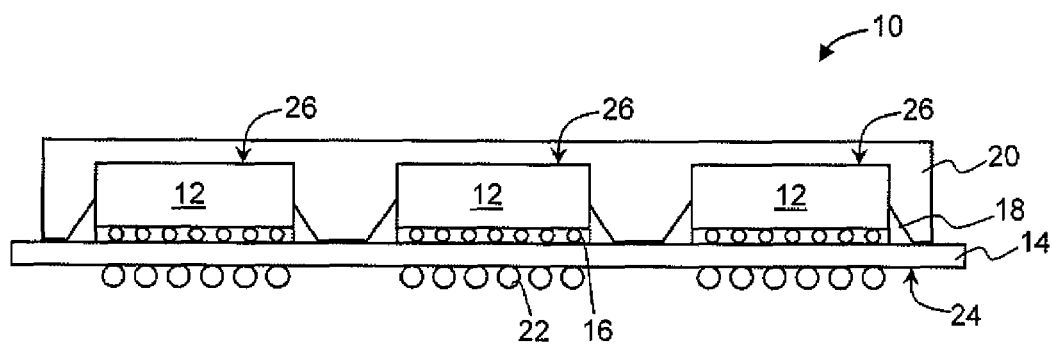
FIGS. 2A to 2D illustrate various process outputs obtained during the process sequence of FIG. 1.

Second-level interconnects 22, e.g. solder balls, may then be provided on a substrate surface 24 distant from the die 12 to provide a connection interface to an external device, e.g., printed circuit board (PCB) (block 110). To this, solder paste or flux may be applied to the substrate surface 24 to provide adhesion sites. Pre-formed solder balls may then be arranged before reflowing to bond the solder balls to the substrate 14. Excess flux remaining on the substrate surface 24 after the reflow may then be removed. FIG. 2A illustrates a pre-grind molded package 10 in its unreduced package and die thicknesses.

Figure 2B:
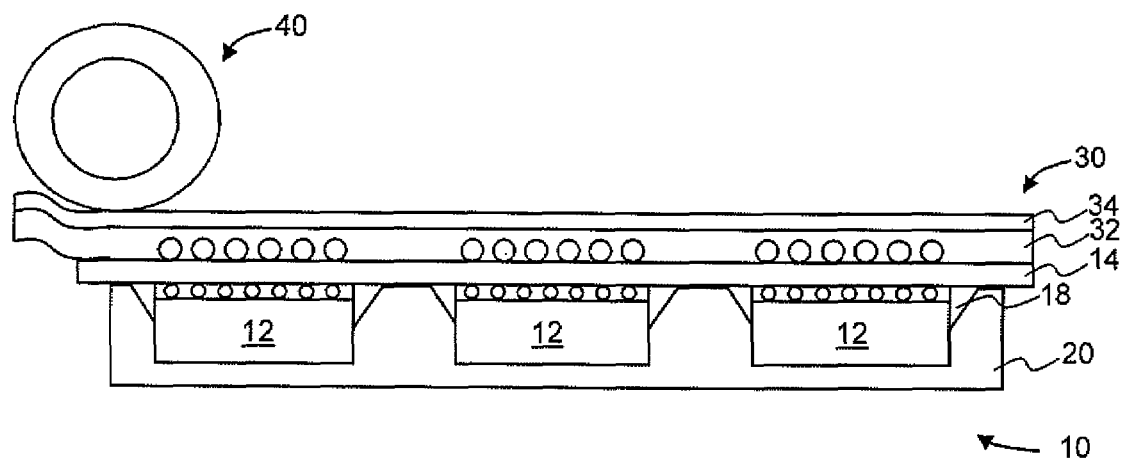

The pre-grind package 10 may be prepared for package grinding by applying a protective layer to enclose the interconnects 22 (block 112). In particular, a protective tape 30 may be applied on the substrate surface 24 on which the second-level interconnects 22 are formed upon. If required, the protective tape 30 may be applied by roller-pressing onto the substrate 14. FIG. 2B illustrates the application of the protective tape 30 using a roller apparatus 40. Upon application, the protective tape 30 would form a substantially even arrangement enclosing the second-level interconnects 22 and flush against the substrate surface 24. As damage to the second-level interconnects 22 may arise due to excessive mechanical stress and contamination arising from package grinding, the substantially even arrangement of the protective tape 30 protects the second-level interconnects 22 from excessive mechanical stress support generated during grinding to preserve the integrity of the interconnects 22.

At this stage, the package 10 comprises a die 12 attached to a package substrate 14 in which the package 10 is at least partially encapsulated in a mold material 20. The protective tape 30 encloses the second-level interconnects 22 to form a substantially even arrangement flush against a substrate surface 24 distant from the die 12.

The protective tape 30 may comprise two or more layers, including at least a pliable layer 32 and a backing layer 34. The pliable layer 32 may demonstrate various material properties to provide specific functions. As an illustration, the pliable layer 32 may comprise a material having adhesive tack to allow easy bond formation when the pliable layer 32 is brought into contact with a surface to be bonded. The adhesive material may be curable such that its adhesive property is decreased upon exposure to a light radiation, e.g., ultraviolet (UV). The decreased adhesive property would assist in removing the protective tape 30 subsequently after the grinding. The pliable layer 32 may also comprise a material having damping or shock absorbent properties to absorb the mechanical stress or pressure generated during grinding. Further, materials employed in the pliable layer 32 would be sufficiently flexible and compliant to conform around the interconnects 22. The backing layer 34 may provide rigid support to the pliable layer 32 to provide a substantially even or planar arrangement after the protective tape 30 has been applied to the package 10.

Examples of materials suitable for use in the pliable layer 32 include, but are not limited to, ultraviolet-curable acrylic and viscoelastics (e.g. natural and synthetic rubbers with tackifiers added, acrylics, and silicones). Examples of materials suitable for used in the backing layer 34 include, but are not limited to, ethylene vinyl acetate (EVA), polyolefin (PO), polyethylene terephthalate (PET) polymer type basefilm (e.g. cellophane), paper (e.g. masking tape), Mylar, and other suitable resins.

In one embodiment of the invention, the thickness of the pliable layer 32 is configured to be at least equal to or greater than the height of the second-level interconnects 22. This is to ensure that the second-level interconnects 22 are fully enclosed and thus protected. The thickness of the backing layer 34 is configured to provide adequate rigid support so that the second-level interconnects 22 may withstand compressive stress generated during grinding. Accordingly, the thickness of the backing layer 34 may depend on factors including, but not limited to, compressive strength and the modulus of elasticity of the backing material used, and thickness of the pliable layer 32.

Figure 2C:
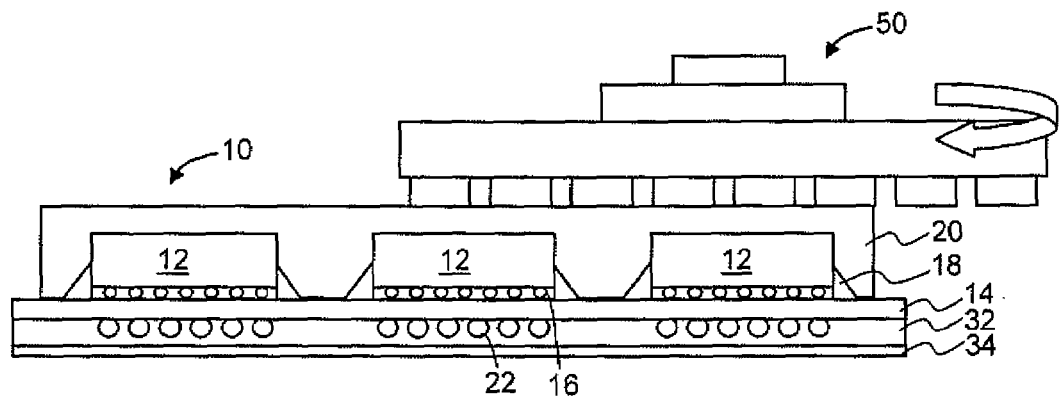

To proceed with grinding to a desired package height or thickness, the molded package 10 may be mounted on a grinder chuck table (block 114). FIG. 2C illustrates an arrangement of a grinder apparatus 50 and the pre-grind package 10. In certain embodiments where the die 12 is incorporated in an overmold package 10, grinding of the package 10 would involve grinding the mold material 20 followed by grinding the die 12 from its back surface 26. This may proceed at two different speeds (e.g. grinding parameter of 4000 rpm and feed rate between 2 µm/s to 5 µm/s for mold grinding; grinding parameter of 3000 rpm and feed rate between 0.15 µm/s to 0.42 µm/s for die grinding). In other embodiments where the die 12 is incorporated in a molded package 10 having an exposed back surface, grinding may proceed with one speed. Package grinding may generate compressive stress which would be absorbed by the pliable layer 32 of the protective tape 30. However, if it is desired to partially depress or partially flatten the interconnects 22, parameters of the pliable 32 and backing layer 34 may be suitably pre-adjusted to release some of the compressive stress to the interconnects 22. One advantage of partially depressed interconnects is improved connection between the post-grind semiconductor package 10" and an external device or PCB.

When the post-grind package 10" has been reduced to the desired thickness, it may be cleaned, such as by washing with de-ionised water, before being removed from the grinder apparatus 50. Subsequently, the protective tape 30 may then be removed from the post-grind package 10" (block 116) in preparation for connecting to an external device or PCB.

Methods for removing the protective tape 30 vary depending on the materials employed in the tape 30. In one method, heat may be applied to an edge of the protective tape 30 to loosen at least a portion of the backing layer 34. The protective tape 30 can then be peeled off from the post-grind package 10" by drawing the loosened portion of the backing layer 34, together with the pliable layer 32, away from the post-grind package 10".

Figure 2D:
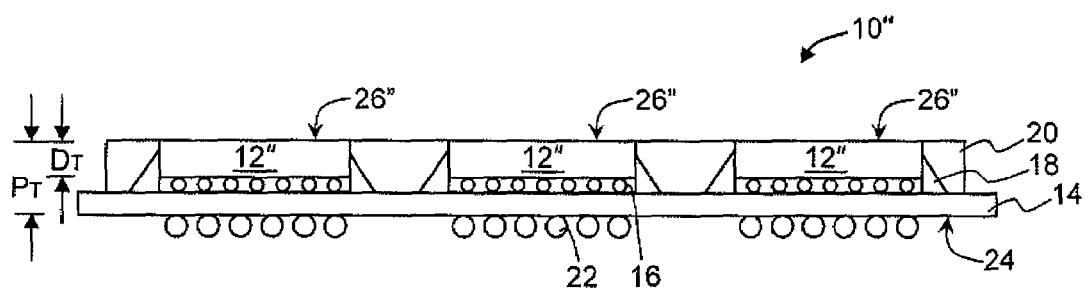

In another method, which is applicable if the protective tape 30 includes a light-curable material, the post-grind package 10" may be exposed to a light radiation, e.g. ultraviolet to deactivate or decrease the adhesive properties of the pliable layer 32. A decrease in adhesive properties allows easy peeling of the protective tape 30 from the substrate 14 without leaving residue thereon. With decreased adhesive force, risk of damage to the substrate 14 due to peeling of the protective tape 30 is reduced. Additionally, the backing layer 34 may include non light-curable materials. FIG. 2D illustrates a post-grind package 10" having reduced or desired die and package thicknesses. In the post-grind package 10", the grinded back surface 26" of the die 12" distant from the substrate 14 may be flush with the mold material 20 and exposed. The back surface 26" of the die 12" may also exhibit markings due to the package grinding process.

Embodiments of the invention are particularly advantageous in achieving a smaller package thickness which may not be achievable in conventional wafer thinning methods. For example, conventional wafer thinning methods may achieve a minimum package thickness of about 1 millimeter (mm) and a minimum die thickness of about 200 micrometers (µm) for a flip chip package. For a post-grind package 10" in one embodiment of the invention, a minimum package thickness ($P_T$) of about 500 µm and a minimum die thickness ($D_T$) of about 50 µm may be achieved for a flip chip package. The above-indicated die and package thicknesses are not inclusive of the height or thickness of interconnects 16, 22 or solder balls. Further, the protective tape 30 is particularly advantageous in protecting the second-level interconnects 22 from mechanical stress generated during grinding, thereby reducing the risk of breakage and damage to the package and die.

In the foregoing description and associated drawings, a plurality of semiconductor dies 12 and, accordingly, molded packages 10 are formed on a strip substrate for simultaneous processing and grinding. This is advantageous in reducing processing costs and achieving uniform post-grind thickness across the strip. However, it should be appreciated that each substrate may contain a single semiconductor die for unit processing in certain embodiments if desired.

Other embodiments will be apparent to those skilled in the art from consideration of the specification and practice of the present invention. Furthermore, certain terminology has been used for the purposes of descriptive clarity, and not to limit the invention. The embodiments and features described above should be considered exemplary, with the invention being defined by the appended claims.

What is claimed is:

1. A method comprising:
    providing a molded semiconductor package having a die attached to a substrate;
    providing a plurality of interconnects on a substrate surface distant from the die;
    applying a protective tape to the substrate surface to form a substantially even arrangement enclosing the plurality of interconnects;
    grinding the molded package to reduce the package thickness, including grinding a mold material and a die surface distant from the substrate, wherein the die surface is exposed and substantially flush with the mold material after grinding and wherein grinding the mold material and grinding the die surface are performed at different speeds; and
    removing the protective tape from the substrate.

2. The method according to claim 1, wherein the protective tape includes a pliable layer to conform around the plurality of interconnects and a backing layer to provide rigid support to the pliable layer.

3. The method according to claim 2, wherein applying the protective tape includes roller-pressing the protective tape against the substrate surface.

4. The method according to claim 2, wherein removing the protective tape from the substrate includes heating a portion of the protective tape to loosen the portion of the protective tape.

5. The method according to claim 2, wherein the pliable layer includes a light-curable material.

6. The method according to claim 5, wherein removing the protective tape from the substrate includes curing the pliable layer of the protective layer by a light radiation to decrease an adhesive property of the pliable layer.

7. The method according to claim 1, wherein grinding the molded package includes grinding a portion of the mold material encapsulating the die prior to grinding the die surface.

8. The method according to claim 1, wherein grinding the molded package is to reduce the thickness of the die to between 50 microns to 200 microns.

9. The method according to claim 1, wherein grinding the molded package is to reduce the thickness of the package to between 500 microns to 1 millimeter.

10. The method according to claim 1, wherein the molded semiconductor package includes an underfill material interposed between the die and the substrate.

* * * * *